United States Patent [19]
Mas

[11] 4,090,131
[45] May 16, 1978

[54] MOVING MAGNET METER HAVING A CLOSED MAGNETIC CIRCUIT ROTOR

[76] Inventor: Joseph A. Mas, 3 Maple Way, Woodbury, N.Y. 11797

[21] Appl. No.: 738,849

[22] Filed: Nov. 4, 1976

Related U.S. Application Data

[63] Continuation-in-part of Ser. No. 708,495, Jul. 26, 1976, abandoned.

[51] Int. Cl.² ............................................. G01R 5/14
[52] U.S. Cl. .................................... 324/146; 324/147
[58] Field of Search ........... 324/146, 144, 147, 154 R; 335/222, 272

[56] References Cited

U.S. PATENT DOCUMENTS

| | | | |
|---|---|---|---|
| 2,439,970 | 4/1948 | Fox | 324/146 |
| 2,710,377 | 6/1955 | Pfeffer | 324/146 |
| 2,968,000 | 1/1961 | Pfeffer | 324/146 |
| 3,094,659 | 6/1963 | Pfeffer | 324/146 |
| 3,671,861 | 6/1972 | Fleetman et al. | 324/146 |
| 3,777,264 | 12/1973 | Erbert | 324/146 |

FOREIGN PATENT DOCUMENTS 693,627 7/1953 United Kingdom ................. 324/146

*Primary Examiner*—Gerard R. Strecker
*Attorney, Agent, or Firm*—Gottlieb, Rackman & Reisman

[57] ABSTRACT

There is disclosed a moving magnet meter of inexpensive construction which has the greater sensitivity, linearity and immunity from extraneous fields of moving coil meters. The rotor consists of a closed magnetic circuit through which a permanent magnet flux flows. The flux intersects the turns of a stationary coil through which the current to be measured flows, part of the closed magnetic circuit rotating within the coil. The strength and area of the permanent magnet flux which intersects the coil is substantially constant throughout an operating angle for the rotor of at least 90°. The return torque for the rotor is derived from a stationary permanent magnet which interacts with the rotor flux and provides a return torque which varies linearly with the rotor angle.

72 Claims, 10 Drawing Figures

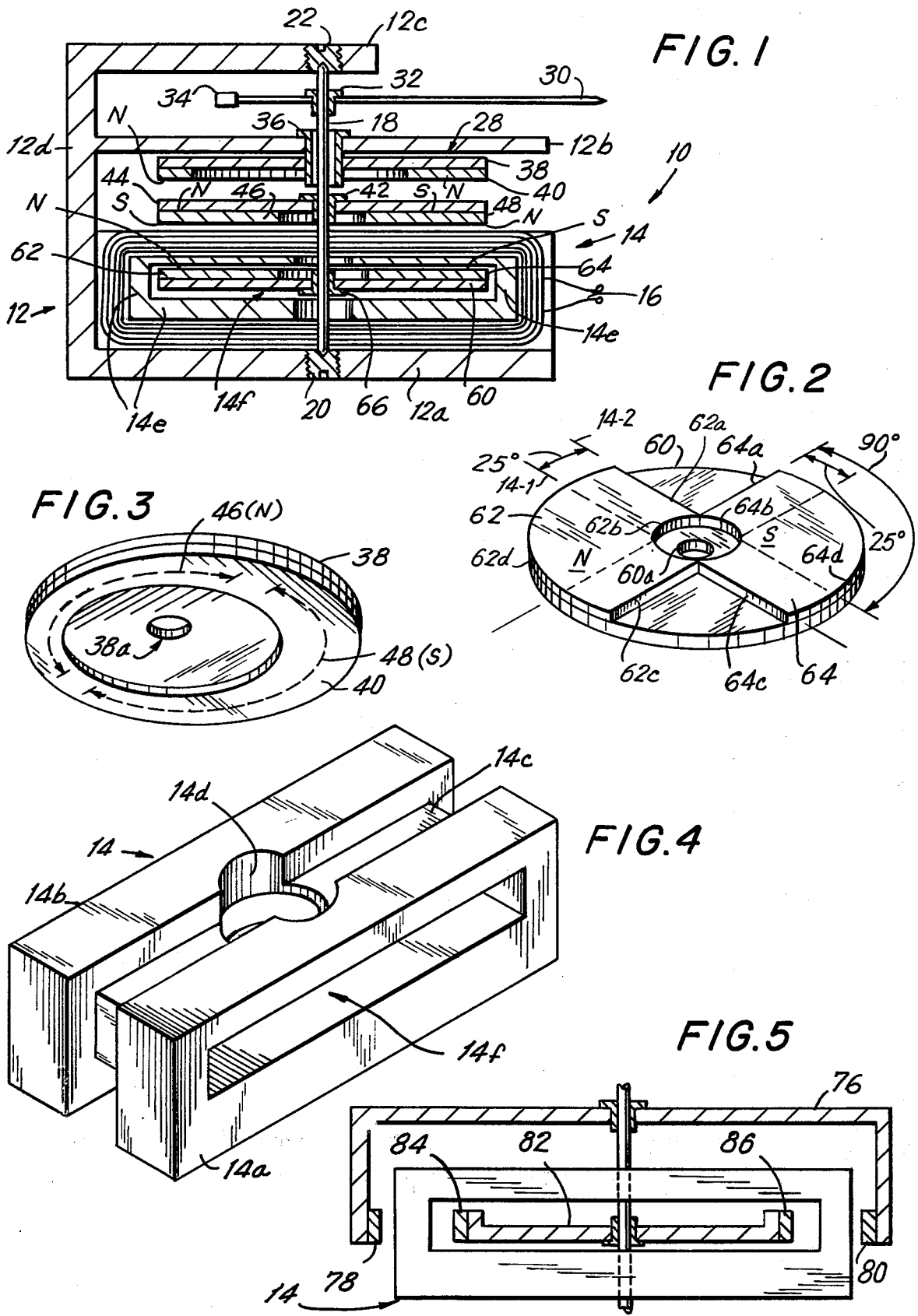

MOVING MAGNET METER HAVING A CLOSED MAGNETIC CIRCUIT ROTOR

This application is a continuation-in-part of my application Ser. No. 708,495 filed on July 26, 1976, now abandoned, and entitled "Moving Magnet Meter."

This invention relates to moving magnet meters, and more particularly to such meters which have not only the usual advantages of moving magnet movements, but also the advantages of moving coil movements such as greater sensitivity, linearity and immunity from extraneous fields.

A conventional moving magnet meter includes an air coil, through which the current to be measured flows, for generating a magnetic flux. Within the coil or external to it there is disposed a small permanent magnet or a small piece of soft iron. The magnet or iron is mounted for rotation under the influence of the magnetic flux induced by the current flowing through the coil. The moving element is biased to a zero position. In the case of a permanent magnet rotor the field of the magnetic element itself biases it in the zero position, and in the case of a soft iron rotor an additional small permanent magnet is usually incorporated in the mechanism for biasing the soft iron in the zero position. In both cases, the rotor is turned by the flux induced by the current flowing through the air coil. The greater the current, the greater the torque applied to the rotor against the restraining torque of the biasing mechanism.

Moving magnet meters, as well as moving iron meters, are characterized by an "open magnetic circuit." All practical mechanisms in which motion is controlled by interacting fluxes and magnetic elements necessarily exhibit air gaps. A small "working gap" is always necessary; if the rotor is free to move there necessarily has to be free space around it. The term "open magnetic circuit" refers to the high reluctance segments throughout the magnetic circuit, not only in the working gap. Cheap meters utilize air coils which in and of themselves offer high reluctance to the induced flux. The magnet of a moving magnet meter is usually magnetized along its diameter and its main return path is through the air around its circumference. As with all open magnets, this field is spread out, weak, and nonlinear. Any attempt to concentrate it, for example, by a soft iron ring, results in the well known "cogging" (preferred position) phenomenom as well as undesirable magnetic hysteresis. It is only within a relatively small range that the angle through which the rotor moves is directly proportional to the magnitude of the current which flows through the coil. Moving magnet meters are also relatively insensitive, large currents being required to turn the rotor, and their operations are affected by stray magnetic fields. The advantage of moving magnet meters is that they are inexpensive.

A moving coil meter, on the other hand, usually includes a stationary soft iron slug, around which a coil is mounted for rotation. The slug and coil are contained within the poles of a permanent magnet. The coil is biased to a zero position by a pair of springs, these springs also serving to conduct current to the two ends of the moving coil. Current flowing through the coil interacts with the permanent magnet flux and causes the rotor to turn, the angle through which the rotor turns being proportional to the magnitude of the current which flows through it. The permanent magnet and central slug provide a closed (low-reluctance) magnetic circuit which is "open" only in the "working gap" in which the rotor turns. The coil rotates in the "working gap" which separates each of the permanent magnet poles from the central slug.

With properly shaped pole faces, the meter can be made highly linear and it can exhibit a large operating angle. Since the coil must turn, it is usually light in weight, and the sensitivity of the movement is usually increased to the desired degree by increasing the strength of the permanent magnet. While moving coil meters offer large operating angles, and high sensitivity, linearity, and immunity from extraneous fields (the latter resulting from the closed magnetic circuit), they have one major disadvantage. Because of their jewel-like quality, they are expensive.

It is a general object of my invention to provide a moving magnet meter which, while inexpensive, has the advantages of a moving coil meter.

In accordance with the principles of my invention, a specially-shaped permanent magnet rotor is mounted for movement both within and without a stationary coil. The magnetic circuit is closed, rather than open, and the permanent magnet rotor is shaped such that no matter what its position (within a large operating angle), the area of the magnets bounded by the coil and its position relative to the coil do not change. In the illustrative embodiments of the invention, the rotor includes two thin soft iron discs. One of these turns within the coil, and on one face there are two oppositely-poled circumferential permanent magnets magnetized along their thickness. Mounted on the same rotor shaft but immediately outside the coil there is the second soft iron disc; preferably, this disc also contains oppositely-poled circumferential permanent magnets also magnetized along their thickness, with the magnets on opposed discs which face each other being similarly poled, i.e., their fluxes aid each other. The disc/magnet arrangement provides a low reluctance, high flux density, closed magnetic circuit through which the permanent magnet flux flows, this flux interacting with the current which flows through the stationary coil. (Although in the preferred embodiments of the invention, four permanent magnet sections are employed, at the very least one is required.) The net result is that an entire, lightweight closed magnetic circuit actually rotates under the influence of the current which flows through the stationary coil. The reluctance in the closed magnetic circuit does not vary with displacement of the rotor.

While prior art moving magnet meters have rarely exhibited linear operation through an angle as high as 60°, the meter of my invention may exhibit high linearity through an angle in excess of 90° as in prior art moving coil meters. No "cogging" is observed, the reluctance in the closed magnetic circuit being constant for all positions of the rotor. The meter sensitivity approximates that of prior art moving coil meters, and because of the use of a closed magnetic circuit there is high immunity from extraneous fields. The rotor axis can even be off center without substantially affecting the meter operation.

The arrangement also permits the use of a completely different kind of bias mechanism. Although springs can be used to bias the rotor, I have found that a specially-shaped thin permanent magnet is all that is required not only to bias the rotor to the zero position, but also to provide a return torque which is directly proportional to the angle through which the rotor has turned. (This condition is necessary for true linearity because the torque which results from the curent flow through the coil is directly proportional to the current, and at any position of the rotor the moving torque and the biasing torque are equal.) In another embodiment of the invention, a different permanent magnet arrangement is used to provide the return torque, an arrangement which facilitates not only adjustment of the zero position but also adjustment of the meter sensitivity.

Further objects, features and advantages of the invention will become apparent upon consideration of the following detailed description in conjunction with the drawing, in which:

FIG. 1 is a sectional view depicting a first illustrative embodiment of the invention;

FIGS. 2, 3 and 4 are perspective views showing three different parts of the meter in greater detail;

FIG. 5 depicts symbolically a second embodiment of the invention;

Figure 6:
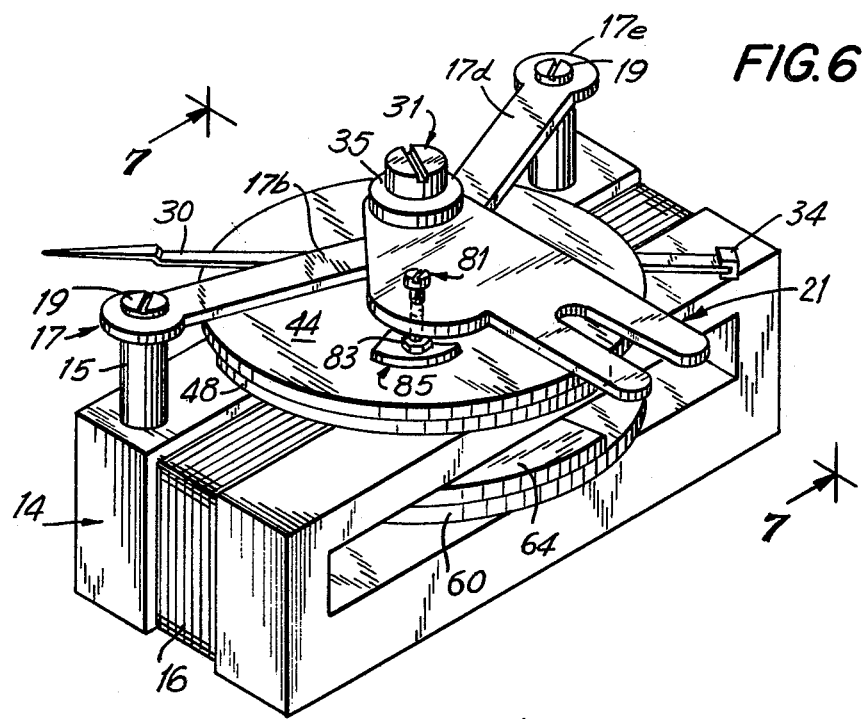
FIG. 6 is a perspective view of a third illustrative embodiment of the invention.

Meter 10 (FIG. 1) includes a brass frame 12 having an upright section 12d, and three horizontal ledges 12a, 12b and 12c. On the bottom ledge 12a there is mounted a bobbin 14, preferably made of copper. The bobbin itself is shown in FIG. 4. It includes two side plates 14a, 14b and a central rectangular section 14c. The central section is hollow, one of the rotor discs to be described below being positioned in the slit 14f. A multi-turn coil is wound around the central section, as shown in FIG. 1; the two ends of the coil are shown by the numeral 16. The current to be measured flows through the coil. The bobbin also includes an enlarged hole 14d extending all the way through it. The rotor shaft 18 (FIG. 1) extends through the center of this hole. The rotor shaft should not make contact with the hole or the turns of the coil in order to minimize friction, and it is for this reason that the diameter of the hole is so much larger than the diameter of the rotor shaft. To insure that the winding turns do not bear against the shaft, a temporary dowel may be inserted through the hole in the bobbin when winding it. The diameter of the hole is larger than the width of the central section 14c; this allows the coil turns to be pressed into the sides of the hole to ensure that they do not bear against the shaft 18. (If necessary, the turns may be held in place by a dab of adhesive.)

Screw pivots 20, 22 are screwed into ledges 12a, 12c. As is known in the art, the rotor shaft is mounted for free rotation in the pivots, the pivots being turned until the shaft is mounted rigidly but is free to turn. The rotor includes two soft iron discs 44, 60 fixed to shaft 18. Disc 60 is contained in slit 14f of the bobbin and disc 44 is above the bobbin. The two discs are secured to the shaft by nylon bushings 42, 66.

Around the periphery of each disc there are mounted two circumferentially-shaped permanent magnets magnetized along their thickness. The two magnets 62, 64 on disc 60 are shown most clearly in FIG. 2. The two magnets are poled in opposite directions. Permanent magnet 62 has its north pole facing upward and permanent magnet 64 has its south pole facing upward.

Similarly, a pair of oppositely-poled circumferentially-shaped permanent magnets 46, 48 are mounted on the underside of soft iron disc 44 above the bobbin. The facing magnets on the two discs are aligned with each other. That is, magnets 46 and 62 are aligned, and magnets 48 and 64 are aligned. Although the two magnets on each disc are oppositely poled, the pairs of magnets which are aligned vertically with each other are poled in the same direction, i.e., their fluxes aid each other.

The four permanent magnets and the two soft iron discs comprise a closed magnetic circuit (a magnetic circuit having only low reluctance paths, permanent magnets and working gaps), with working gaps immediately above the bobbin and immediately above disc 60 and its permanent magnets. Flux flows out of the north pole of magent 62, through the coil, and into the south pole of magnet 46. The flux then flows through soft iron disc 44 into the south pole of magnet 48. Flux flows out from the north pole of magnet 48, through the coil, and into the south pole of magnet 64. The magnetic circuit is completed by the flux flowing from the north pole of magnet 64 through soft iron disc 60 into the south pole of magnet 62.

The various elements secured to ledge 12b function to bias the rotor to a zero position and to provide a return torque which opposes the torque generated by current flowing through coil 16. The bias mechanism will be described below, but for the moment it can be assumed that the biasing mechanism is the equivalent of a conventional biasing spring whose torque varies linearly with the rotor angle.

At the top of shaft 18 there is mounted a conventional pointer 30. The pointer is secured by a bushing 32, and a counter-weight 34 is provided as is known in the art for balancing purposes.

It will be recalled that a charge which moves in a magnetic field has a force applied to it in a direction which is perpendicular both to the direction of the field and the direction in which the charge moves. The relationship is characterized by the well-known "left-hand rule": If the thumb and first two fingers of the left hand are in mutually perpendicular directions, and the first finger points in the direction of the field while the second finger points in the direction of the charge (positive) movement, then the thumb points in the direction of the force applied to the charge. Consider a current flowing through coil 16 in the clockwise direction of FIG. 1. Each "positive charge" thus moves from left to right between the discs and, when employing the left-hand rule, the second finger points to the right. The flux between magnets 62 and 46 flows upward, and thus the first finger points upward in the plane of the paper. In such a case, the thumb points upward out of the plane of the paper. This represents a force on each positive charge flowing in the coil from left to right between magnets 62 and 46. It must be understood, however, that the force on each charge is a force relative to the magnetic field. The charges in coil 10 cannot move upward out of the plane of the paper because they flow only through the coil. The only thing which can move is the magnetic field itself which is mounted for rotational movement with shaft 18. Consequently the upward force on the charges out of the plane is the equivalent of a downward force on the magnetic circuit into the plane of the paper. Thus there is a force which tends to turn magnets 46 and 62 in the clockwise direction when looking down at the meter of FIG. 1.

Insofar as permanent magnets 48 and 64 are concerned, a similar result is obtained. The charges move in the same direction (left to right) in the upper half of each coil turn on the right side of the bobbin of FIG. 1. But the flux on the right side of the bobbin is directed downward rather than upward. Consequently, the force on magnets 48 and 64 is upward out of the plane of the paper, rather than downward into the plane of the paper. This force also turns the rotor in the clockwise direction.

Although the above analysis has been in terms of individual charges, the overall torque, for any given flux density, is necessarily a function of the product of the current and the number of turns in the winding (i.e., the total number of moving charges within the flux field). The greater the current, the greater the torque. And although the analysis above was in terms of a clockwise current through coil 16 (FIG. 1) resulting in a clockwise turning of the rotor when viewed from above, it is apparent that a current in the opposite direction results in a counter-clockwise turning of the rotor.

The preferred embodiments of the invention include four permanent magnets, two such magnets being mounted on each of the soft iron discs. The discs are necessary in order to provide a closed magnetic circuit. But four magnets are not necessary. Theoretically, only one magnet is necessary to set up a permanent flux in the closed magnetic circuit/working gap path. But in order to balance the rotor, it is desirable to use two or four magnets. (The use of magnets on both soft iron discs, since they are oppositely poled, also eliminates the effect of the earth's magnetic field without requiring any shielding.) It should also be noted that the torque which turns the rotor does not result from the fact that permanent magnets are included within the stationary coil 16. It is intersection of the permanent magnet flux with the coil that results in the application of a torque to the rotor. Thus permanent magnets 62 and 64 could be omitted and the meter would still function. (Disc 60 should not be omitted, however, because without the disc there would be no closed magnetic circuit.)

In a similar fashion, still another soft iron disc could be disposed beneath the bobbin. This disc could contain two additional permanent magnets for forming a second closed magnetic circuit with disc 60. (Two additional permanent magnets could be placed on the underside of disc 60 if desired, the permanent magnet field necessarily increasing with the number of permanent magnets used. The important thing is that the rotor contain a closed magnetic circuit of constant reluctance through which a constant permanent magnet flux flows, the permanent manget flux intersecting the coil.) The second, lower magnetic circuit would take advantage of the current flowing through the bottom half of the coil. At a slightly additional expense, a considerable increase in sensitivity may be obtained. Of course, the magnets on the top of the lower disc (if magnets are included on this disc) and the magnets on the underside of disc 60 (if magnets are included on this disc) must be poled so that the generated torque is in the same direction as that produced by the upper magnetic circuit.

One of the most significant advantages of the arrangement is that the torque on the rotor is a linear function of current through a rotor angle which can be well in excess of 90° — a degree of linearity which is far greater than that of a conventional moving magnet meter. The shape of the magnets can be best appreciated with reference to FIG. 2. The two magnets 62, 64 are mounted on soft iron disc 60, the disc having a central hole 60a through which bushing 66 (FIG. 1) is inserted. Each magnet has a shape defined by four edges. The four edges of magnet 64 are labeled 64a through 64d. The dimensions of the magnets of FIG. 2 are designed to provide a linear operating angle of 90°.

Dashed lines 14-1, 14-2 represent the edges of central section 14c of the bobbin when the rotor is in the zero position. The operation is linear for as long as the flux which intersects the bobbin coil is constant. The shape of the magnets is determined by drawing the two dashed lines 14-1, 14-2 on the disc (centered around the axis of the disc), and then drawing two similar perpendicular lines (shown in dashed form on FIG. 2). The two straight edges 62a, 62c are along two of the dashed lines as shown in FIG. 2. The curved edged 62b is simply a semi-circle drawn between the points where the dashed lines intersect as shown in the drawing. Curved edge 62d is along the outer edge of disc 60.

Assume that disc 60 rotates in the clockwise direction of FIG. 2 from the zero position which is shown. The flux from magnet 62 which intersects the coil within the dashed lines 14-1, 14-2 remains constant until edge 62c reaches dashed line 14-1. Thereafter, were disc 60 to rotate further, some of the coil turns would not be intersected by flux lines. When edge 62c is adjacent dashed line 14-1, it is apparent that the disc will have rotated through an angle of 90°. Consequently, the operation is linear through this angle. Similar remarks apply to magnet 64. A larger linear operating angle can be achieved by using larger magnets, that is, by covering up more of the disc with the magnets. However, since this necessarily increases the weight of the rotating magnetic circuit, the greater linear operating angle is accompanied by a decrease in sensitivity.

As shown in FIG. 2, the width of the bobbin 14 is such that each end intersects a 25°-arc along the circumference of disc 60. In order to achieve a linear operating angle of 90°, it is apparent that each magnet must extend through an angle of 90° plus 12.5° at each end, i.e., through a total angle of 115°. In general, no matter how wide the bobbin, for a linear operating angle of 90° each magnet must extend through an angle of 90° plus the arc along the disc circumference intersected by the bobbin.

The actual width of the central section 14c of the bobbin is determined by other considerations. The wider the central section, the greater the number of coil turns which can be wound on it and thus the greater the sensitivity. However, it is apparent that if the width of the central section increases, the radius of edge 62b also increases. As the radius of edge 62b increases, the difference between the radii of edges 62b and 62d decreases, i.e., the width of each magnet decreases. This, in turn, results in fewer flux lines intersecting the coil on the bobbin and a lower sensitivity since the sensitivity is a function not only of the number of coil turns but also of the total flux which intersects those turns. Thus as the width of the central section of the bobbin is varied, the sensitivity both increases and decreases as a result of different factors. I have found that for the highest sensitivity, the width of section 14c should be such that it intersects the edge of disc 60 along an arc of approximately 25°, as shown in FIG. 2.

There is another factor which contributes to this preferred angle of approximately 25°. Referring to FIG. 2, while the sensitivity of the meter decreases because of the decreased flux which intersects the coil turns as the radius of edge 62b increases, the sensitivity also increases because of the reduced weight of the magnets. Generally speaking, as the width of the magnets is decreased, the sensitivity increase due to the reduced weight may actually exceed the sensitivity decrease due to the fewer flux lines which intersect the coil turns. However, I have found that there is yet another factor which reduces the sensitivity as the magnets are made narrower. Referring to FIG. 1, the flux from the north pole of magnet 48 flows downward to the south pole of magnet 64 and then through disc 60 to the south pole of magnet 62. But if magnets 48 and 64 are reduced in width, some of the flux which leaves magnet 64 may flow upward from disc 60 to disc 44; not all of the flux stays in disc 60 to flow toward magnet 62. The "leakage" flux which flows upward on the right side of FIG. 1 results in the generation of a torque which opposes the torque generated by the main flux which flows downward between magnets 48 and 64, and thus decreases the sensitivity. The narrower the magnets, that is, the greater the "uncovered" areas of the soft iron discs, the greater the leakage flux. For this reason, it is better to use wider magnets then narrow magnets.

All things considered, I have found that a bobbin width corresponding to an arc of approximately 25°, together with maximum-width magnets as shown in FIG. 2, results in the greatest sensitivity.

It is apparent that the moving torque applied to the rotor is a function of only the current through the coil. Since the flux which intersects the coil is the same no matter what the rotor position (through the maximum linear operating angle), the torque is a function of the current only. The greater the current, the greater the torque. The return torque applied by a conventional spring, or the biasing means to be described below, increases with the angle of rotation of the rotor. For any given current, the rotor comes to rest at an angular position at which the return torque equals the current-generated torque. Consequently, provided that the return torque is a linear function of angle, the meter operates linearly through an angle which can exceed 90°.

A multi-turn coil is not necessary. In fact, all that is required is a single turn coil such as a single wire positioned between the two opposed discs with their permanent magnets. The advantage of the use of a single wire, or just a few turns which are parallel to each other between the discs, is that in such a case the working gap between the discs can be made smaller. This, in turn, increases the flux density because of the lower reluctance in the overall flux path. A higher flux density is an advantage because the meter sensitivity is a function of the product of the flux density, the current, and the number of turns in the coil. But because the number of turns can usually be increased by a greater factor than that by which the flux density is decreased as a result of the greater space required by a coil, the use of a multi-turn coil is preferred, even if it necessitates the use of a bobbin and a larger separation of the discs.

The magnet material itself should have a high energy product (BH) per unit weight; the rotor should be designed so that the ratio of "working flux energy" (the working gap flux density squared, times the gap width) to the rotor weight is as high as possible. For this reason rare-earth magnets are preferred, although magnets made of plastic barium ferrite also provide superior results. In general, I have found that the following design rules also lead to the best possible construction:

1. The thickness of the magnets should be small compared to the rotor diameter.
2. The working gap should be equal to $2t_m/\mu$ where $t_m$ is the thickness of each magnet and $\mu$ is the permeability of the magnet material used.
3. The iron discs must conduct the flux from one side of the gap to the other without saturating but should be as thin as possible, and their total weight should not exceed one-half of the total magnet weight.
4. The weight and inertia of the pointer and counterweight should be as small as possible compared to the rotor weight.
5. For maximum sensitivity and damping, the product $B^2g$ should be as high as possible per unit rotor weight, where B is the flux density in the working gap of length g.

Antoher significant advantage of the meter of my invention is that there is no need for the shaft 18 to be centered with any degree of precision; there is really no such thing as an off-axis condition. The exact position of shaft 18 in FIG. 1 in the horizontal direction is of little importance. Equal and opposite forces are applied to the two permanent magnets on any disc no matter what the horizontal position of the disc in FIG. 1.

Although the manner in which the rotor is biased to the zero position will be described below, the zero position of the rotor relative to the bobbin should be understood before proceeding to a description of the bias mechanism. As shown in FIG. 2, disc 60 is in the desired zero position when the meter is to be used to measure a direct current, with the current flowing such that the disc rotates clockwise in FIG. 2. With the initial position as shown in FIG. 2, and with a uni-directional current flowing through the coil, the rotor can turn through an angle of 90° before the two gaps between the magnets reach the confines of the bobbin. Thus the meter operates linearly through an angle of approximately 90°. It is apparent, however, that if the coil current can flow in either direction, the zero position of FIG. 2 will not be satisfactory for currents which flow in the reverse direction. Such currents result in a counter-clockwise direction of rotation for the rotor of FIG. 2, and the gaps immediately move beneath the coil. For this reason, if the current to be measured can flow in either direction, the zero position for the rotor should be that in which the diameter between the two magnets is perpendicular to the long axis of the bobbin, i.e., the zero position for the rotor should be 45° away from the position shown in FIG. 2 relative to the bobbin. This arrangement permits rotation of the rotor through an angle of 45° in either direction before the movement becomes non-linear.

The bobbin 14 is made of a conductive material, preferably copper. As is known in the art, the moving element of any meter tends to overshoot, and then oscillate as it comes to rest at the deflection position at which the moving torque is balanced by the return torque. The overshoot and oscillation can be minimized by damping the rotor movement, and this is accomplished most simply by using a conductive metal for the bobbin. As the lines of flux in the closed magnetic circuit move through the bobbin, eddy currents are set up in the bobbin. These currents apply an opposing torque to the rotor and cut down on the overshoot and any subsequent oscillation. The eddy currents flow in the two side flanges 14b of the bobbin, as well as in the central section 14c. The flanges are wide and thick so that their resistance is minimal; the larger the eddy currents, the greater the damping.

For the same reason, it is desirable to make the central section of the bobbin, around which the coil is wound, as thick as possible. Three sides of the central section, labeled 14e in FIG. 1, are relatively thick for this reason. It is only the upper leg of the central section that is relatively thin. It is apparent that the thicker this leg, the greater the gap between the permanent magnets. Since the smaller the gap, the greater the permanent flux of the rotor, the upper leg is made relatively thin. In general, every effort should be made to minimize the gap between the two rotor sections. Minimal clearance is provided between the permanent magnets on each disc and the bobbin. Furthermore, while the bottoms of the two side flanges 14b may extend well below the bottom of the coil as shown in FIG. 1, the flanges should not extend up past the upper end of the coil. (In FIG. 1, the upper end of the coil is shown flush with the upper ends of the side flanges.) The excess height of the side flanges would simply increase the gap without providing any advantage, and this is to be avoided.

Before proceeding to a description of the novel biasing means used in the first embodiment of my invention, reference should be made to the alternative construction of FIG. 5. Instead of using two discs 44, 60, it is possible to use two soft iron cylinders 76, 82. Each of the cylinders is fixed to shaft 18 by a respective bushing. Each of the cylinders is also closed at one end to provide a return path for the permanent magnet flux. Semicylindrical permanent magnets 84, 86 are attached to the outside surface of the inner cylinder 82 and semicylindrical permanent magnets 78, 80 are attached to the inner surface of outer cylinder 76. The permanent magnet flux in the embodiment of FIG. 5 intersects the turns of the coil on the vertical sides of the bobbin 14. The flux in the working gap is now horizontal, and the moving charges which create the torque now move in a vertical direction. By employing the left-hand rule, it is apparent that if the four magnets are all poled in the same direction (thus aiding each other, as in the embodiment of FIG. 1, to set up a permanent magnet flux in the closed magnetic circuit/working gap path), the torque generated on one side of the rotor is up out of the plane of the paper and the torque generated on the other side of the rotor is down into the plane of the paper.

Although not shown in FIG. 5, it is to be understood that the return torque can be developed by conventional springs or there can be employed a magnetic biasing mechanism comparable to that shown in FIG. 1 and to be described below. The advantage of the cylindrical construction is that a greater total flux can be obtained simply by increasing the heights of the cylinders and the permanent magnets. Of course, with such increases the weight of the rotor increases. In general, the disc construction is preferred because, for the same developed torque, the rotor can be made lighter in weight. The principles of operation of the embodiment of FIG. 5 are the same as those of the embodiment of FIG. 1; in both cases, circumferentially-shaped permanent magnets of opposite polarities (when viewed from the center) are mounted on the discs or cylinders, and no matter what the angular position of the rotor, the total flux (flux density times area) intersecting the coil is constant.

The biasing means in the meter of FIG. 1 consists of a disc 38 (soft iron or non-magnetic, e.g., plastic) on the bottom of which there is mounted an asymmetrically shaped permanent magnet 40. A nylon bushing 36 secured in the central hole 38a of disc 38 is attached by a friction fit to ledge 12b (FIG. 1). Bushing 36 does not engage shaft 18, the shaft passing through but not touching it. A small space 28 separates disc 38 from ledge 12b. This facilitates turning of the disc (and its attached magnet); although bushing 36 is secured by a friction fit in ledge 12b, the disc and bushing can be turned in order to adjust the zero bias. As the disc is turned slightly, the rotor turns with it until pointer 30 is in the desired zero position (on a scale, not shown). Magnet 40 not only biases the rotor to the desired zero position, it also provides a return torque which is a linear function of the angle through which the rotor has turned from the zero position.

Magnet 40 generates a flux which reacts weakly with magnets 46 and 48. (More accurately, magnet 40 interacts with the permanent magnet flux in disc 44 but the operation is easier to understand by considering the interaction to be with magnets 46 and 48.) The interaction can be best understood with reference to FIG. 3. This figure shows the north pole of biasing magnet 40. Superimposed on this north pole are two dashed lines 46, 48. Dashed line 46 represents the north pole of magnet 46 which faces the biasing magnet, and dashed line 48 represents the south pole of magnet 48 which faces the biasing magnet. It is apparent that the flux of magnet 46 opposes the flux of magnet 40, while the flux of magnet 48 aids the flux of magnet 40. The rotor automatically turns until there is a maximum aiding of flux and a minimum opposition of flux. Magnet 40 has circular outer and inner edges, but the inner edge is offset relative to the outer edge, thus decreasing the area of the magnet on the left side of FIG. 3 and increasing the area on the right side. With no current flowing through coil 16, the rotor automatically turns until magnet 46 is centered on the left side of magnet 40, magnet 46 — whose flux opposes that of magnet 40 — thus being adjacent the smallest possible area of magnet 40. At the same time, magnet 48 centers itself on the largest possible area of magnet 40, since the fluxes of the two magnets aid each other. It is thus apparent that the angular position of magnet 40 determines the zero position of the rotor. Depending on whether the current to be measured flows in only one direction or two directions, a gross adjustment of 45° in the position of magnet 40 is made. Thereafter, a minor adjustment of a few degrees is generally all that is required to zero pointer 30.

As the rotor is turned by the torque generated by current flowing through the coil, magnets 46, 48 move relative to biasing magnet 40. Whether the rotation is in the clockwise or counter-clockwise direction of FIG. 3, there is a torque acting on the rotor which tends to return it to the zero position. The torque increases linearly with the angle through which the rotor has turned from the zero position due to the offset circular edges of magnet 40; the width of magnet 40 along any radius varies linearly with angle. It is apparent, for example, that after the rotor has turned 180°, the north pole of magnet 46 is adjacent the largest possible area of magnet 40. (The maximum turning of the rotor may be held to slightly under 180°, e.g., by providing a stop for this purpose, in order to insure that when the current ceases, the rotor returns in the reverse direction. Were the rotor allowed to turn past 180°, e.g., by over-running a half turn, it might return to the zero position by continuing the rotate and pointer 30 might engage frame 12 if it is too long.)

Although conventional hair springs can be used to provide the return torque as is known in the art, the magnetic bias offers several advantages. Foremost is the fact that the construction is relatively simple and requires a minimum of labor. Also, it is well known that spring characteristics change with temperature and age. While the same is true of the strength of a permanent magnet, the changes in the meter of FIG. 1 balance each other out. Any change in temperature or age which reduces the flux in the closed magnetic circuit/working gap path also reduces the strength of magnet 40. Thus while the return torque may decrease, so does the torque (for any given current) which turns the rotor in the first place. Another advantage of the magnetic bias is that, if desired, a non-linear response (e.g., an enlarged scale for lower or higher values of current) can be obtained by changing the shape of magnet 40. For example, by reducing the width of the magnet still further in the narrow region, the pointer deflection per unit current change will increase at the high end of the scale.

Figure 7:
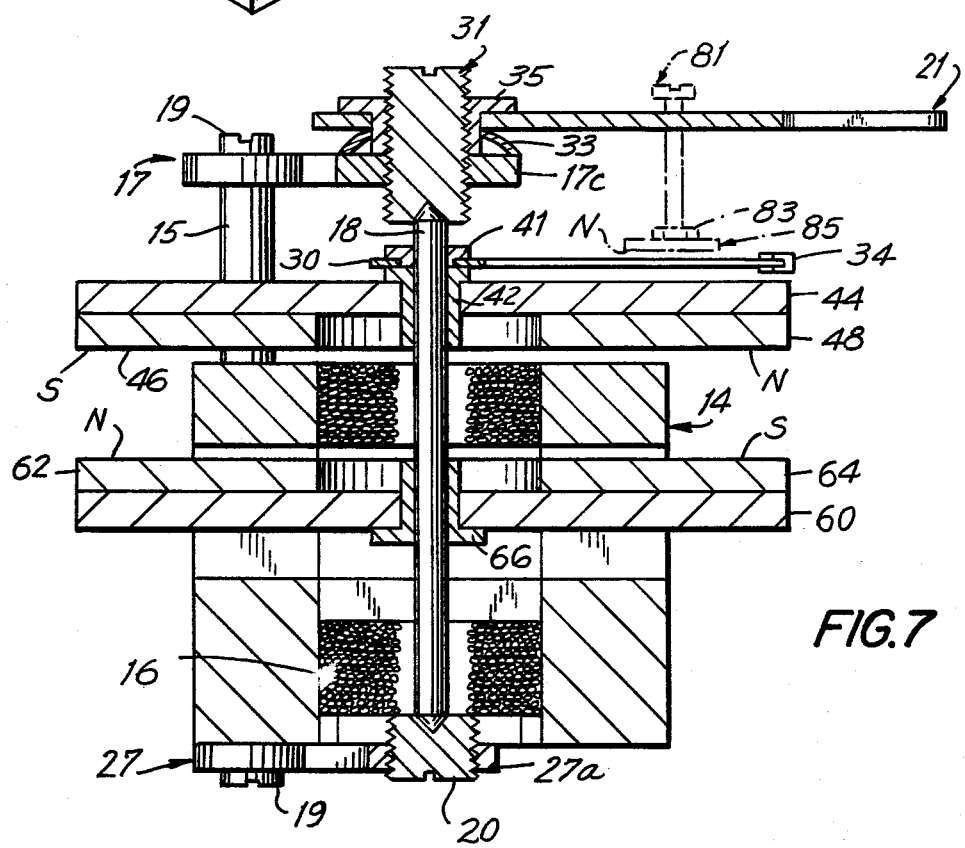
FIG. 7 is a sectional view through line 7—7 of FIG. 6.

The embodiment of the invention shown in FIGS. 6 and 7 is different in several respects, although the basic rotor/bobbin arrangement is the same as that shown in FIG. 1. Instead of using a separate frame for supporting the rotor shaft 18, brackets for supporting the shaft are mounted directly on the bobbin. A first bracket 17 is provided with three circular sections 17a, 17c, 17e, connected by straight legs 17b, 17d. A pair of spacers 15 is used for spacing the bracket from the bobbin, two screws 19 being extended through respective sections 17a, 17e of the bracket and the spacers, and being secured in screw holes in one of the side flanges of the bobbin. As shown most clearly in FIG. 7, a screw pivot is turned within a screw thread in central section 17c of bracket 17, the lower end of the screw pivot bearing down against the upper end of shaft 18.

A similar bracket 27 is attached at the bottom of the bobbin, this bracket being secured by a pair of screws 19 and having a central section 27a which carries a screw pivot 20 for supporting the lower end of shaft 18. Bracket 27 is not provided with spacers and is secured directly against the bottom of the bobbin. The spacers are provided only for the upper bracket which must be maintained sufficiently above the bobbin so as to allow the upper rotor section to rotate directly above the bobbin.

The rotor itself is similar to that shown in FIG. 1. A bushing 66 secures a soft-iron disc 60 to the shaft in the hollow central section of the bobbin, with two permanent magnets 62, 64 being secured to the disc. Similarly, bushing 42 secures soft-iron disc 44 to the shaft above the bobbin, with permanent magnets 46, 48 being secured to the underside of the disc. A third bushing 41 secures pointer 30 to shaft 13 directly above the upper rotor section, counter-weight 34 being disposed at the short end of the pointer.

In addition to a different mounting arrangement, the embodiment of the invention shown in FIGS. 6 and 7 is provided with a different form of magnetic bias, for controlling not only the zero position of the rotor but also for adjusting the meter sensitivity. Screw 81 extends through plastic bracket 21 and terminates in nut or swivel 83. A small permanent magnet 85, magnetized along its thickness, is attached to the underside of the swivel. The lower face of the permanent magnet 85 is a north pole and thus attracts the south or upper face of rotor magnet 48.

In assembling the meter, after screw pivot 31 is screwed into place, spring washer 33 is placed over the screw pivot on top of bracket 17. The over-sized hole in bracket 21 is then placed over the screw pivot and threaded nut 35 is screwed into place around the screw pivot. The combination of nut 35 and spring washer 33 serves to maintain bracket 21, friction-tight but still capable of rotation around the pivot screw for zero-setting the pointer. Rotation of bracket 21, with small magnet 85 along with it, causes the rotor, and therefore the attached pointer, to follow it. Thus the pointer, in the absence of coil current, can be made to point exactly at zero on a dial (not shown).

As described above, most of the permanent magnet flux in the motor flows through the soft-iron discs. However, there is a small portion of flux which flows out of the discs. A small amount of flux from the south pole of magnet 48 flows in a vertical direction through disc 44 to interact with the north pole of magnet 85. Similarly, after the rotor has turned, some of the flux from the north pole of magnet 46 interacts with the north pole of magnet 85. It is this flux, interacting with magnet 85 by initially attracting the south pole face of magnet 48 and subsequently repelling the north pole face of magnet 46, that controls both the zero-set and the sensitivity (deflection angle per unit coil current) of the meter.

The north pole of magnet 85 attracts magnet 48. Since the attraction is greatest where there is the highest concentration of flux lines, the rotor automatically turns until magnet 85 is centered on magnet 48.

It is thus apparent that as bracket 21 is turned, the rotor follows it. In order to insure that the pointer points to the zero position of the scale (not shown) without any energizing current, bracket 21 is turned until this condition is obtained.

Under the influence of a current flowing through the coil, the rotor turns from the zero position. As the rotor turns, there is an increasing torque which tends to return it to the zero position. This torque is a maximum after the rotor has turned nearly 180° in either direction at which point the north pole of magnet 85 reacts most strongly with the high concentration of flux lines at the center of the north pole of magnet 46. In between the two extreme positions (the zero position, and the position after the rotor has turned nearly 180°), the return torque varies approximately linearly with angle. Actually, linearity is required only over the first 90° which is the required travel of the rotor and pointer. Consequently, magnet 85 serves the same function as magnet 40 in the first embodiment of the invention, i.e., the same function as a conventional hairspring; it provides a return torque which increases linearly with angle. The degree of interaction between the stray flux of magnets 46, 48 and magnet 85 is a function of the spacing of magnet 84 from the other two magnets. As screw 81 is turned to decrease the spacing the interaction increases, that is, for any angle through which the rotor has turned, the return torque is greater. This, in turn, means that a larger current is required for a full-scale deflection. Conversely, as the screw is turned to increase the spacing, the interaction is weaker and, due to the decreased return torque, a smaller current is required for a full-scale deflection. Thus, after the zero position is established by turning bracket 21, in order to adjust the meter sensitivity all that is required is to apply a full-scale current to the coil and to turn screw 81 until pointer 30 assumes a full-scale position.

After the zero position and sensitivity are adjusted, nut 83 can be turned on screw 81 (while the screw is not turned so that the spacing remains fixed except for an insignificant change due to the turning of the nut) so that the orientation of magnet 85 relative to magnet 48 can be set to provide a linear operation.

Figure 8:
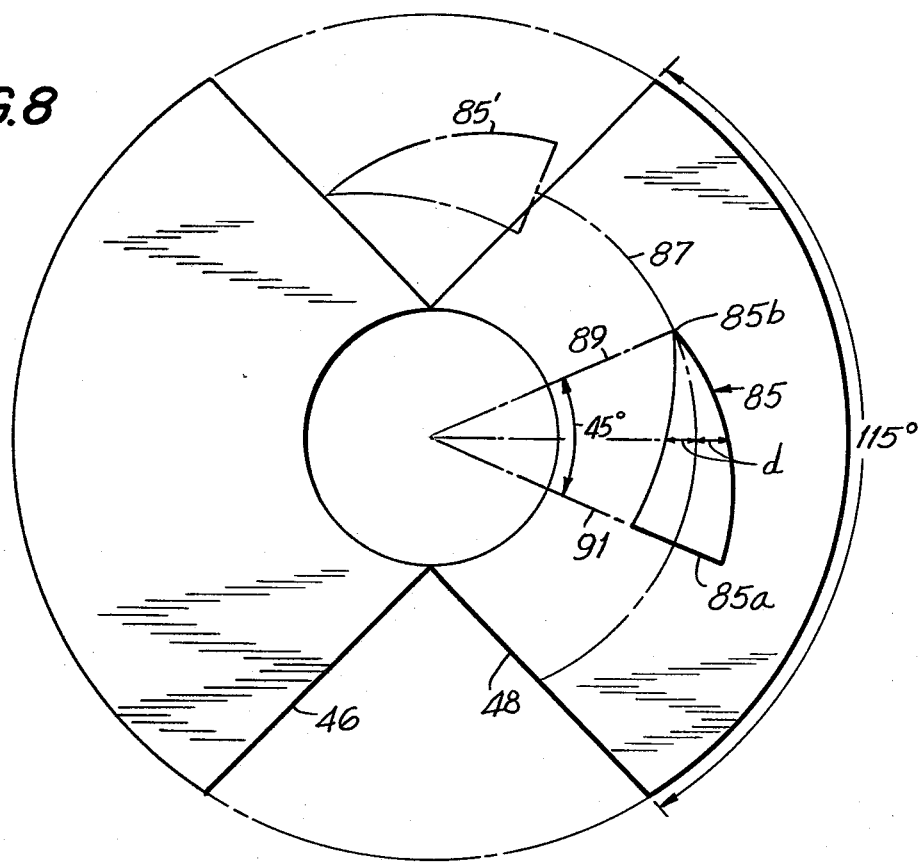
FIG. 8 depicts the shape of the return-torque magnet 85 for the uni-directional current meter of FIGS. 6 and 7.

FIG. 8 depicts the shape of the magnet 85 and its orientation to produce a linear operation for a uni-directional current meter thorugh an angle of 90°. In FIG. 8, magnet 85 is shown positioned on top of the center of magnet 48 (the zero position). (Although not shown in FIG. 8, the pointer is fixed relative to magnets 46 and 48, and extends symmetrically between them, i.e., in a vertical direction in FIG. 8). Magnet 85 is basically triangular in shape, but its long edges are curved due to the curvature of magnet 48. From the base 85a of magnet 85 to the tip 85b, the magnet subtends an angle of 45°, base 85a being shown along a radius 91 of the rotor, tip 85b being along another radius 89, and the two radii being separated by 45°. The shape of magnet 85 is determined as follows. A hypothetical arc 87 is drawn which passes through tip 85b of the magnet. For any radius, the widths of magnet 85 on either side of arc 87 (shown by the letter d in FIG. 8) are equal. Such a shape provides a truly linear return torque through an angle approaching 180°, provided that magnet 85 is oriented so that it is symmetrical about arc 87 throughout its length. After the spacing of magnet 85 relative to magnet 48 is determined by the turning of screw 81, nut 83 is turned to achieve the proper orientation for magnet 85 that results in a linear operation.

Magnet 85 is shown in FIG. 8 by the phantom shape 85' to indicate its position relative to magnet 48 after the rotor has turned 90° through its operating range, assuming that the rotor turns in the clockwise direction of FIG. 8. Even as the rotor continues to turn so that magnet 85 has no part of either permanent magnet underneath it, it sill interacts with the stray permanent magnet flux to provide a linear return torque. As the rotor continues to turn through the total angle of 180°, the return torque increases as a result of the repelling force between magnet 85 and magnet 46.

Figure 9:
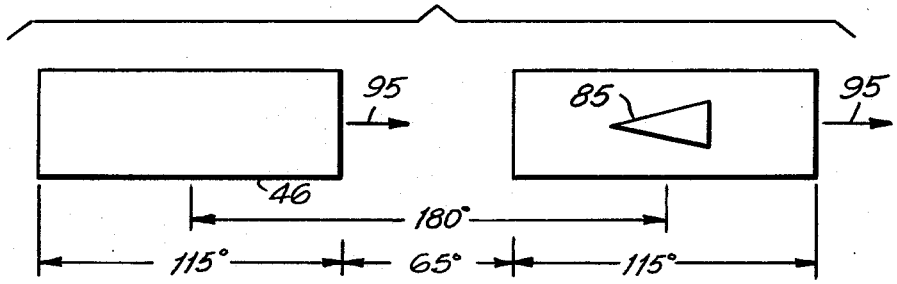
FIG. 9 illustrates the operating principle of the magnet of FIG. 8.

FIG. 9 depicts the shape of magnet 85 which produces the desired return torque in the case of magnets with straight edges. As the two magnets 46, 48 move to the right (as shown by arrows 95) relative to stationary magnet 85, the return torque (the force tending to move magnets 46, 48 back to the left) increases linearly as a function of linear displacement. In order to achieve the same effect with the rotor magnets having curved edges, the sides of magnet 85 in FIG. 8 should be curved as described above. While this is true from a theoretical standpoint, in actual practice I have found that the return torque is a linear function of displacement (that is, a linear function of the angle through which the rotor has turned) even if magnet 85 has a true triangular shape.

Figure 10:
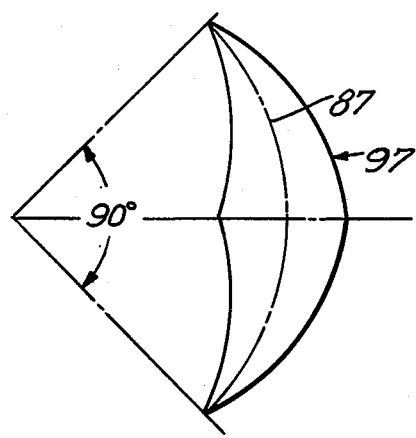
FIG. 10 depicts the shape of the return-torque magnet for use in a bi-directional current meter.

In FIG. 8 it is assumed that the rotor turns only in the clockwise direction, i.e., that the uni-directional current is to be measured. If the current can flow in either direction, as in the case of a meter with zero at center of scale (e.g., as in a charge-discharge ammeter), then the permanent magnet used to generate the return torque should be symmetrical in shape, as shown by magnet 97 in FIG. 10, and should subtend an angle of 90°. In such a case, the return torque is a linear function of the angular displacement of the rotor through approximately a 90° turn in either direction, even though only 45° travel in each direction is all that is required. In the uni-directional meters discussed above, in the zero position an edge of each magnet is located along an edge of the coil (see FIG. 2), the return magnet 85 is positioned in the center of one of the rotor magnets, and the pointer points to an end of the scale. In a bi-directional meter, the pointer also is fixed relative to the rotor magnets such that is extends between them in a symmetrical manner. Because the pointer in the zero position must usually point to the middle of the scale, the magnet 97 must be positioned in the middle of the bobbin (coil) so that the rotor moves until each of its magnets is centered on the coil.

Although the invention has been described with reference to particular embodiments, it is to be understood that these embodiments are merely illustrative of the application of the principles of the invention. For example, pointer 30 and counterweight 34 may actually be attached to the top of disc 44, rather than to be mounted separately. Thus it is to be understood that numerous modifications may be made in the illustrative embodiments of the invention and other arrangements may be devised without departing from the spirit and scope of the invention.

What I claim is:

1. A meter movement comprising a stationary coil for conducting a current therethrough; rotor means mounted for rotation relative to said coil, said rotor means constituting a closed magnetic circuit with a working gap and having a first flux-carrying section within said coil, a second flux-carrying section outside said coil in facing relation with said first section, and permanent magnet means mounted on at least one of said first and second sections and shaped to provide a permanent magnet flux for flowing through said first and second sections and said working gap and for intersecting a portion of said coil within said working gap, the permanent magnet flux which intersects said coil portion being substantially constant throughout an operating angle for said rotor means; and means for biasing said rotor means to a zero position and for providing a return torque which increases with the angle through which said rotor means is turned from said zero position.

2. A meter movement in accordance with claim 1 wherein said stationary coil is wound on a bobbin; said first flux-carrying section being disposed within said bobbin and said second flux-carrying section being disposed outside said bobbin; said rotor means including a shaft mounted for rotation relative to said bobbin and passing through said bobbin, said shaft being secured to both of said first and second flux-carrying sections; the portion of said coil within said working gap being in a plane substantially perpendicular to the intersecting permanent magnet flux lines.

3. A meter movement in accordance with claim 2 wherein said bobbin is made of conducting material to provide damping for the movement of said rotor means.

4. A meter movement in accordance with claim 3 wherein said biasing means includes a stationary permanent magnet mounted for reacting with the permanent magnet flux of said rotor means.

5. A meter movement in accordance with claim 4 further including means for adjusting the angular position of said stationary permanent magnet to control the zero position of said rotor means.

6. A meter movement in accordance with claim 5 further including means for adjusting the spacing between said stationary permanent magnet and said rotor means to control the sensitivity of the meter movement.

7. A meter movement in accordance with claim 6 wherein said operating angle is at least 90°.

8. A meter movement in accordance with claim 1 wherein said biasing means includes a stationary permanent magnet mounted for reacting with the permanent magnet flux of said rotor means.

9. A meter movement in accordance with claim 8 further including means for adjusting the angular position of said stationary permanent magnet to control the zero position of said rotor means.

10. A meter movement in accordance with claim 9 further including means for adjusting the spacing between said stationary permanent magnet and said rotor means to control the sensitivity of the meter movement.

11. A meter movement in accordance with claim 1 wherein said permanent magnet means includes at least two permanent magnets of opposite polarities mounted on one of said first and second sections and facing the other of said sections for aiding each other and causing a permanent magnet flux to flow in a closed magnetic circuit/working gap path which includes said first and second sections.

12. A meter movement in accordance with claim 11 wherein said biasing means includes a stationary permanent magnet mounted in facing relationship with one of said first and second flux-carrying sections, said stationary permanent magnet extending around the axis of said rotor means and having a radial width which varies linearly with angle, said stationary permanent magnet aiding the flux of one of said at least two permanent magnets and opposing the flux of the other such that the return torque applied thereby to said rotor means varies linearly with the angular position of said rotor means.

13. A meter movement in accordance with claim 12 further including means for adjusting the angular position of said stationary permanent magnet to control the zero position of said rotor means.

14. A meter movement in accordance with claim 13 wherein said operating angle is at least 90°.

15. A meter movement in accordance with claim 1 wherein said operating angle is at least 90°.

16. A meter movement in accordance with claim 1 wherein said first and second flux-carrying sections are soft-iron discs mounted for movement together on a common axis extended through said coil, and said permanent magnet means includes two circumferentially-shaped permanent magnets of opposite polarities mounted on each of said discs, all of said permanent magnets being mounted on the facing sides of said discs and being poled to aid each other and to cause a permanent magnet flux to flow in a closed magnetic circuit/working gap path which includes said soft-iron discs.

17. A meter movement in accordance with claim 16 wherein said stationary coil is wound on a bobbin; said first flux-carrying section being disposed within said bobbin and said second flux-carrying section being disposed outside said bobbin; said rotor means including a shaft mounted for rotation relative to said bobbin and passing through said bobbin, said shaft being secured to both of said first and second flux-carrying sections; the portion of said coil within said working gap being in a plane substantially perpendicular to the intersecting permanent magnet flux lines.

18. A meter movement in accordance with claim 17 wherein said bobbin is made of conducting material to provide damping for the movement of said rotor means.

19. A meter movement in accordance with claim 16 wherein said biasing means includes a stationary permanent magnet mounted for reacting with the permanent magnet flux of said rotor means.

20. A meter movement in accordance with claim 19 further including means for adjusting the angular position of said stationary permanent magnet to control the zero position of said rotor means.

21. A meter movement in accordance with claim 20 further including means for adjusting the spacing between said stationary permanent magnet and said rotor means to control the sensitivity of the meter movement.

22. A meter movement in accordance with claim 21 wherein said operating angle is at least 90°.

23. A meter movement in accordance with claim 16 wherein said operating angle is at least 90°.

24. A meter movement in accordance with claim 16 wherein said biasing means includes a stationary permanent magnet mounted in facing relationship with one of said first and second flux-carrying sections, said stationary permanent magnet extending around the axis of said rotor means and having a radial width which varies linearly with angle, said stationary permanent magnet aiding the flux of one of the two permanent magnets on said one flux-carrying section and opposing the flux of the other such that the return torque applied thereby to said rotor means varies linearly with the angular position of said rotor means.

25. A meter movement in accordance with claim 1 wherein said first and second flux-carrying sections are soft-iron cylinders each closed at one end and mounted for movement together on a common axis extended through said coil, and said permanent magnet means includes two circumferentially-shaped permanent magnets of opposite polarities mounted around each of said cylinders, all of said permanent magnets being mounted on the facing surfaces of said cylinders and being poled to aid each other and to cause a permanent magnet flux to flow in a closed magnetic circuit/working gap path which includes said soft-iron cylinders.

26. A meter movement in accordance with claim 25 wherein said stationary coil is wound on a bobbin; said first flux-carrying section being disposed within said bobbin and said second flux-carrying section being disposed outside said bobbin; said rotor means including a shaft mounted for rotation relative to said bobbin and passing through said bobbin, said shaft being secured to both of said first and second flux-carrying sections; the portion of said coil within said working gap being in a plane substantially perpendicular to the intersecting permanent magnet flux lines.

27. A meter movement in accordance with claim 26 wherein said bobbin is made of conducting material to provide damping for the movement of said rotor means.

28. A meter movement in accordance with claim 25 wherein said operating angle is at least 90°.

29. A meter movement in accordance with claim 1 wherein said biasing means includes a stationary permanent magnet mounted in facing relationship with one of said first and second flux-carrying sections, said stationary permanent magnet extending around the axis of said rotor means and having a radial width which varies as a function of angle, said stationary permanent magnet reacting with the flux of said rotor means such that the return torque applied thereby to said rotor means varies in a predetermined manner with the angular position of said rotor means.

30. A moving magnet meter comprising:
a stationary coil for carrying a current to be measured,
first and second flux-carrying elements, at least one of said elements being magnetized,
said first flux-carrying element being mounted within said coil for rotatable movement relative to said coil,
said second flux-carrying element being mounted outside said coil for rotatable movement with said first flux-carrying element relative to said coil,
a closed magnetic circuit including said first flux-carrying element, a first air gap between said first flux-carrying element and said second flux-carrying element, said second flux-carrying element, and a second air gap between said second flux-carrying element and said first flux-carrying element,
a portion of the flux of said magnetized element flowing through said closed magnetic circuit,
a first portion of said coil being positioned in said first air gap and a second portion of said coil being positioned in said second air gap,
a portion of the flux in said closed magnetic circuit passing through said first and second coil portions in a direction substantially perpendicular to the turns of said coil, and
means for biasing said first and second flux-carrying elements to a zero position and for providing a return force which increases with the angle through which said elements are turned from said zero position.

31. A moving magnet meter in accordance with claim 30 wherein said stationary coil is wound on a bobbin; said first flux-carrying element being disposed within said bobbin and said second flux-carrying element being disposed outside said bobbin; and further including a shaft mounted for rotation relative to said bobbin and passing through said bobbin, said shaft being secured to both of said first and second flux-carrying elements.

32. A moving magnet meter in accordance with claim 31 wherein said bobbin is made of conducting material to provide damping for the turning of said first and second flux-carrying elements.

33. A moving magnet meter in accordance with claim 30 wherein said biasing means includes a stationary permanent magnet mounted for reacting with the flux of at least one of said flux-carrying elements.

34. A moving magnet meter in accordance with claim 33 further including means for adjusting the angular position of said stationary permanent magnet to control the zero position of said first and second flux-carrying elements.

35. A moving magnet meter in accordance with claim 34 further including means for adjusting the spacing between said stationary permanent magnet and said at least one flux-carrying element to control the sensitivity of the meter.

36. A moving magnet meter in accordance with claim 30 wherein the angle through which said first and second flux-carrying elements turn varies linearly with the current carried by said coil through an operating angle of at least 90°.

37. A moving magnet meter in accordance with claim 30 wherein said biasing means includes a stationary permanent magnet mounted in facing relationship with one of said first and second flux-carrying elements, said stationary permanent magnet extending around the axis of said elements and having a radial width which varies with angle, said stationary permanent magnet reacting with a portion of the flux in said closed magnetic circuit such that the return force applied thereby to said elements varies in a predetermined manner with the angular position of said elements.

38. A moving magnet meter in accordance with claim 37 further including means for adjusting the angular position of said stationary permanent magnet to control the zero position of said elements.

39. A moving magnet meter comprising:
a stationary coil for carrying a current to be measured,
first and second magnets,
said first magnet being mounted within said coil for rotatable movement relative to said coil,
said second magnet being mounted outside said coil for rotatable movement with said first magnet relative to said coil,
a magnetic circuit comprising said first magnet, a first air gap between said first magnet and said second magnet, said second magnet, and a second air gap between said second magnet and said first magnet,
a portion of the flux of said magnets flowing through said magnetic circuit,
a portion of said coil being positioned in said first air gap and a portion of said coil being positioned in said second air gap,
a portion of the flux in said magnetic circuit passing through said first and second coil portions in a direction substantially perpendicular to the turns of said coil, and
means for biasing said first and second magnets to a zero position and for providing a return force which increases with the angle through which said magnets are turned from said zero position.

40. A moving magnet meter in accordance with claim 39 wherein said stationary coil is wound on a bobbin; said first magnet being disposed within said bobbin and said second magnet being disposed outside said bobbin; and further including a shaft mounted for rotation relative to said bobbin and passing through said bobbin, said shaft being secured to both of said first and second magnets.

41. A moving magnet meter in accordance with claim 40 wherein said bobbin is made of conducting material to provide damping for the turning of said first and second magnets.

42. A moving magnet meter in accordance with claim 39 wherein said biasing means includes a stationary permanent magnet mounted for reacting with the flux of at least one of said magnets.

43. A moving magnet meter in accordance with claim 42 further including means for adjusting the angular position of said stationary permanent magnet to control the zero position of said first and second magnets.

44. A moving magnet meter in accordance with claim 43 further including means for adjusting the spacing between said stationary permanent magnet and said at least one magnet to control the sensitivity of the meter.

45. A moving magnet meter in accordance with claim 39 wherein the angle through which said first and second magnets turn varies linearly with the current carried by said coil through an operating angle of at least 90°.

46. A moving magnet meter in accordance with claim 39 wherein said biasing means includes a stationary permanent magnet mounted in facing relationship with one of said first and second magnets, said stationary permanent magnet extending around the axis of said magnets and having a radial width which varies with angle, said stationary permanent magnet reacting with a portion of the flux of at least one of said magnets such that the return force applied thereby to said elements varies in a predetermined manner with the angular position of said elements.

47. A moving magnet meter in accordance with claim 46 further including means for adjusting the angular position of said stationary permanent magnet to control the zero position of said elements.

48. A cogless meter movement comprising a stationary coil for conducting a current therethrough; rotor means mounted for rotation relative to said coil, said rotor means having a closed magnetic circuit with a working gap and a fixed reluctance independent of rotor displacement for conducting a predetermined constant permanent magnet flux therethrough, said rotor means being mounted such that for any displacement within the operating range the permanent magnet flux in said working gap intersects a portion of said coil, the permanent magnet flux which intersects said coil portion being substantially constant throughout the operating range of said rotor means; and means for biasing said rotor means to a zero position and for providing a return torque which increases with the angle through which said rotor means is turned from said zero position.

49. A cogless meter movement in accordance with claim 48 wherein said stationary coil is wound on a bobbin; and said rotor means includes a first flux-carrying section disposed within said bobbin and a second flux-carrying section disposed outside said bobbin and a shaft mounted for rotation relative to said bobbin and passing through said bobbin, said shaft being secured to both of said first and second flux-carrying sections; the portion of said coil within the working gap between said first and second flux-carrying sections being in a plane substantially perpendicular to the intersecting permanent magnet flux lines.

50. A cogless meter movement in accordance with claim 49 wherein said bobbin is made of conducting material to provide damping for the movement of said rotor means.

51. A cogless meter movement in accordance with claim 50 wherein said biasing means includes a stationary permanent magnet mounted for reacting with the permanent magnet flux of said rotor means.

52. A cogless meter movement in accordance with claim 51 further including means for adjusting the angular position of said stationary permanent magnet to control the zero position of said rotor means.

53. A cogless meter movement in accordance with claim 52 further including means for adjusting the spacing between said stationary permanent magnet and said rotor means to control the sensitivity of the meter movement.

54. A cogless meter movement in accordance with claim 53 wherein said operating range is at least 90°.

55. A cogless meter movement in accordance with claim 48 wherein said biasing means includes a stationary permanent magnet mounted for reacting with the permanent magnet flux of said rotor means.

56. A cogless meter movement in accordance with claim 55 further including means for adjusting the angular position of said stationary permanent magnet to control the zero position of said rotor means.

57. A cogless meter movement in accordance with claim 56 further including means for adjusting the spacing between said stationary permanent magnet and said rotor means to control the sensitivity of the meter movement.

58. A cogless meter movement in accordance with claim 48 wherein said stationary coil is wound on a bobbin; and said rotor means includes a first flux-carrying section disposed within said bobbin and a second flux-carrying section disposed outside said bobbin, permanent magnet means mounted on each of said flux-carrying sections facing and aiding each other for causing said permanent magnet flux to flow in a closed magnet circuit/working gap path which includes said first and second flux-carrying sections, and a shaft mounted for rotation relative to said bobbin and passing through said bobbin, said shaft being secured to both of said first and second flux-carrying sections; the portion of said coil within the working gap between said first and second flux-carrying sections being in a plane substantially perpendicular to the intersecting permanent magnet lines.

59. A cogless meter movement in accordance with claim 58 wherein said biasing means includes a stationary permanent magnet mounted for reacting with the permanent magnet flux in said rotor means and means for adjusting the angular position of said stationary permanent magnet to control the zero position of said rotor means.

60. A cogless meter movement in accordance with claim 59 wherein said operating range is at least 90°.

61. A cogless meter movement in accordance with claim 59 wherein the operation of the movement is linear throughout an operating range of at least 90°.

62. A cogless meter movement in accordance with claim 61 wherein said bobbin is made of conducting material to provide damping for the movement of said rotor means.

63. A cogless meter movement in accordance with claim 58 wherein the operation of the movement is linear throughout an operating range of at least 90°.

64. A cogless meter movement in accordance with claim 63 wherein said bobbin is made of conducting material to provide damping for the movement of said rotor means.

65. A cogless meter movement in accordance with claim 48 wherein said biasing means includes a stationary permanent magnet mounted for reacting with the permanent magnet flux in said rotor means and means for adjusting the angular position of said stationary permanent magnet to control the zero position of said rotor means.

66. A cogless meter movement in accordance with claim 65 wherein said operating range is at least 90°.

67. A cogless meter movement in accordance with claim 65 wherein the operation of the movement is linear throughout an operating range of at least 90°.

68. A cogless meter movement in accordance with claim 48 wherein said bobbin is made of conducting material to provide damping for the movement of said rotor means.

69. A substantially cogless electro-mechanical meter comprising:
 a stationary coil, a rotatable closed magnetic circuit, said magnetic circuit being mounted for rotation about an axis, said magnetic circuit including:

first and second ferro-magnetic members spaced from each other by a working gap, at least one of said ferro-magnetic members having a permanent magnetic portion, the flux of said permanent magnetic portion having a path that is completed through said working gap and the other of said ferro-magnetic members, said coil extending through said working gap, said flux intersecting a portion of said coil within said working gap, the interaction between said flux and any current through said portion of said coil producing a torque tending to rotate said magnetic circuit about said axis, said permanent magnetic portion of said at least one of said ferro-magnetic members including a pole face shaped to provide a substantially constant flux intersecting said portion of said coil throughout a predetermined angle of rotation of said coil, and means for providing a return torque for said magnetic circuit.

70. The meter of claim 69 wherein said working gap has first and second portions at first and second locations in said magnetic circuit, said coil extending through said first and second portions of said working gap.

71. The meter of claim 70 wherein said predetermined angle of rotation is at least 90°.

72. The meter of claim 69 wherein said predetermined angle of rotation is at least 90°.

* * * * *